United States Patent
Li et al.

(10) Patent No.: US 12,532,766 B2
(45) Date of Patent: Jan. 20, 2026

(54) ELECTRONIC PACKAGE AND ELECTRONIC STRUCTURE THEREOF

(71) Applicant: SILICONWARE PRECISION INDUSTRIES CO., LTD., Taichung (TW)

(72) Inventors: Yung-Ta Li, Taichung (TW); Po-Kai Huang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 726 days.

(21) Appl. No.: 17/866,878

(22) Filed: Jul. 18, 2022

(65) Prior Publication Data
US 2023/0369268 A1 Nov. 16, 2023

(30) Foreign Application Priority Data
May 13, 2022 (TW) .................. 111118102

(51) Int. Cl.
*H01L 23/00* (2006.01)

(52) U.S. Cl.
CPC .............. *H01L 24/13* (2013.01); *H01L 24/16* (2013.01); *H01L 24/32* (2013.01); *H01L 24/73* (2013.01); *H01L 2224/13007* (2013.01); *H01L 2224/13014* (2013.01); *H01L 2224/13018* (2013.01); *H01L 2224/13147* (2013.01); *H01L 2224/1357* (2013.01); *H01L 2224/16227* (2013.01); *H01L 2224/16238* (2013.01); *H01L 2224/32225* (2013.01); *H01L 2224/73204* (2013.01); *H01L 2924/182* (2013.01); *H01L 2924/3511* (2013.01); *H01L 2924/3512* (2013.01); *H01L 2924/37001* (2013.01)

(58) Field of Classification Search
CPC ......... H01L 24/13; H01L 24/16; H01L 24/32; H01L 2224/0401; H01L 2224/16–16055; H01L 2224/13–13014; H01L 2224/13018; H01L 2224/1357
See application file for complete search history.

(56) References Cited

U.S. PATENT DOCUMENTS

| | | | |
|---|---|---|---|
| 6,583,040 B1 * | 6/2003 | Lin | H01L 21/4853 438/611 |
| 6,667,229 B1 * | 12/2003 | Lin | H01L 24/11 257/772 |
| 7,087,466 B1 * | 8/2006 | Lin | H01L 21/6835 438/118 |
| 9,269,683 B2 * | 2/2016 | Daubenspeck | H01L 23/49816 |
| 12,170,207 B2 * | 12/2024 | Chen | H01L 23/3171 |
| 2006/0012024 A1 * | 1/2006 | Lin | H05K 3/3436 257/E23.068 |
| 2014/0206146 A1 * | 7/2014 | Lin | H01L 24/85 438/113 |

(Continued)

*Primary Examiner* — Mohammed Shamsuzzaman
(74) *Attorney, Agent, or Firm* — Dority & Manning, PA

(57) ABSTRACT

An electronic package is provided in which an electronic structure is bonded onto a carrier structure via a plurality of conductive elements, where each of the conductive elements is connected to a single contact of the electronic structure via a plurality of conductive pillars. Therefore, when one of the conductive pillars fails, each of the conductive elements can still be electrically connected to the contact via the other of the conductive pillars to increase electrical conductivity.

10 Claims, 11 Drawing Sheets

(56) References Cited

U.S. PATENT DOCUMENTS

| | | | |
|---|---|---|---|
| 2018/0277491 A1* | 9/2018 | Joshi | H01L 23/3736 |
| 2020/0176397 A1* | 6/2020 | Liu | H01L 23/562 |
| 2022/0199562 A1* | 6/2022 | Waidhas | H01L 24/96 |

* cited by examiner

ELECTRONIC PACKAGE AND ELECTRONIC STRUCTURE THEREOF

BACKGROUND

1. Technical Field

The present disclosure relates to a semiconductor device, in particular, to an electronic package and electronic structure thereof which can improve packaging reliability.

2. Description of Related Art

The conventional flip chip semiconductor packaging technology forms solder elements (solder bumps) on the contacts of the semiconductor chip, and then electrically connects to the packaging substrate directly via the solder elements. Compared with the method of wire bonding, the circuit path of flip chip technology is shorter and has better electrical quality, and at the same time the heat dissipation of the semiconductor chip may be improved due to it can be designed in the form of exposed chip back.

As shown in a semiconductor chip 1 of FIG. 1A and FIG. 1B, an integrated circuit is formed on a chip body 11, an electrode pad 12 is arranged on the outermost side, an insulating layer 13 such as a passivation layer is formed on the chip body 11 and the integrated circuit (but the electrode pad 12 is exposed), and a conductive element 15 is formed on the electrode pad 12 for bonding onto a packaging substrate, wherein an opening 130 exposing the electrode pad 12 is formed on the insulating layer 13, so that the conductive element 15 extends into the opening 130 and serves as a conductive pillar 14, and the conductive element 15 is electrically connected to the electrode pad 12 via the conductive pillar 14.

However, in the conventional semiconductor chip 1, the ratio of a depth D to a width R of the conductive pillar 14 (i.e., the aspect ratio) is extremely small, such that the conductive element 15 cannot be securely disposed on the electrode pad 12. Therefore, when the packaging substrate and the conductive element 15 of the semiconductor chip 1 are flip-chip bonded, the conductive element 15 is prone to stress concentration on the conductive pillar 14 due to extrusion, resulting in the problem that the conductive element 15 is broken at the conductive pillar 14.

Furthermore, when the conductive pillar 14 is broken and electrically fails, the conductive element 15 and the electrode pad 12 are disconnected, resulting in poor electrical conductivity of the semiconductor chip 1.

Therefore, there is a need for a solution that addresses the aforementioned shortcomings of the prior art.

SUMMARY

In view of the aforementioned shortcomings of the prior art, the present disclosure provides an electronic structure, which comprises: an electronic body; a plurality of contacts disposed on the electronic body; at least one insulating layer having a plurality of openings and formed on the electronic body, wherein parts of a surface of each of the contacts are exposed from the plurality of openings; a plurality of conductive pillars disposed in the plurality of openings and electrically connected to the plurality of contacts; and a plurality of conductive elements disposed on the plurality of conductive pillars, wherein each of the conductive elements is connected to each of the contacts via the plurality of conductive pillars.

In the aforementioned electronic structure, at least one of the plurality of openings has an aspect ratio greater than 0.38.

In the aforementioned electronic structure, the plurality of conductive pillars have a same aspect ratio.

In the aforementioned electronic structure, at least two of the plurality of conductive pillars have different aspect ratios.

In the aforementioned electronic structure, the insulating layer is discontinuously arranged on the electronic body, such that the insulating layers between the adjacent conductive elements are free from being connected to each other.

The present disclosure further provides an electronic package, which comprises: a carrier structure comprising a substrate body having a circuit layer, an insulating protective layer formed on the substrate body, and a plurality of electrical contact pads disposed on the insulating protective layer, wherein the plurality of electrical contact pads are electrically connected to the circuit layer via a plurality of conductive blind vias; and the aforementioned electronic structure bonded to the plurality of electrical contact pads via the plurality of conductive elements thereof.

In the aforementioned electronic package, each of the electrical contact pads is electrically connected to the circuit layer via the plurality of conductive blind vias.

In the aforementioned electronic package, the plurality of conductive blind vias have an aspect ratio different from an aspect ratio of the plurality of conductive pillars.

In the aforementioned electronic package, each of the electrical contact pads has a vertical projection area greater than a vertical projection area of each of the conductive elements.

In the aforementioned electronic package, aspect ratios of the conductive pillars corresponding to at least two of the plurality of conductive elements are different.

As can be understood from the above, the electronic package and the electronic structure thereof according to the present disclosure increase the aspect ratio of each of the conductive pillars by connecting each of the conductive elements and each of the contacts via the plurality of conductive pillars, so that the yield of electroplating the conductive pillars can be improved and each of the conductive elements can be stably disposed on each of the contacts, thereby enhancing the reliability of the entire electronic structure. Therefore, compared with the prior art, when the electronic structure of the present disclosure is bonded onto a carrier structure via the conductive elements thereof, the conductive elements may disperse stress via the plurality of conductive pillars during extrusion so as to prevent the conductive elements from breaking at the conductive pillars.

Furthermore, the plurality of conductive pillars are used as electrical connection paths between each of the conductive elements and each of the contacts, so that when one of the conductive pillars fails, the other conductive pillars can still be used for electrical connection, the electrical conductivity thus can be increased.

BRIEF DESCRIPTION OF THE DRAWINGS

FIG. 4B-2 is a schematic top view of another aspect of FIG. 4B-1.

FIG. 4B-3 and FIG. 4B-4 are schematic top views of other aspects of FIG. 4B-2.

DETAILED DESCRIPTION

Figure 1A:
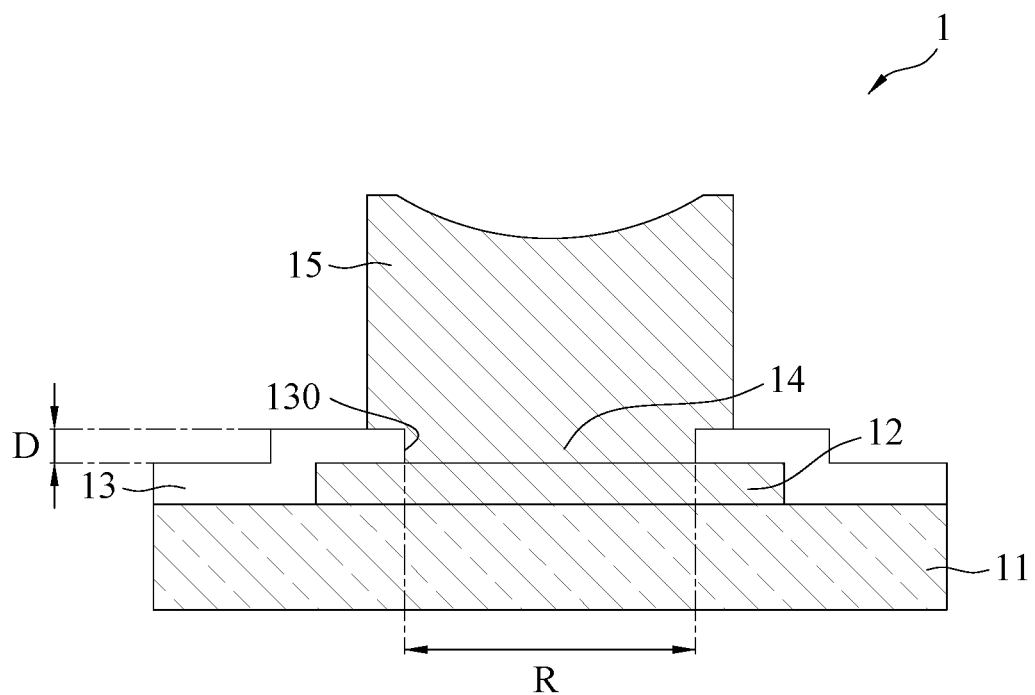
FIG. 1A is a schematic partial cross-sectional view of a conventional semiconductor chip.
Figure 1B:
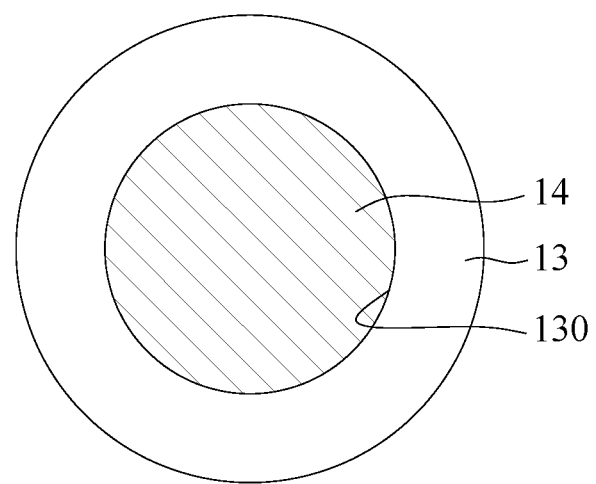
FIG. 1B is a schematic partial top view of FIG. 1A.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "above," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

Figure 2A:
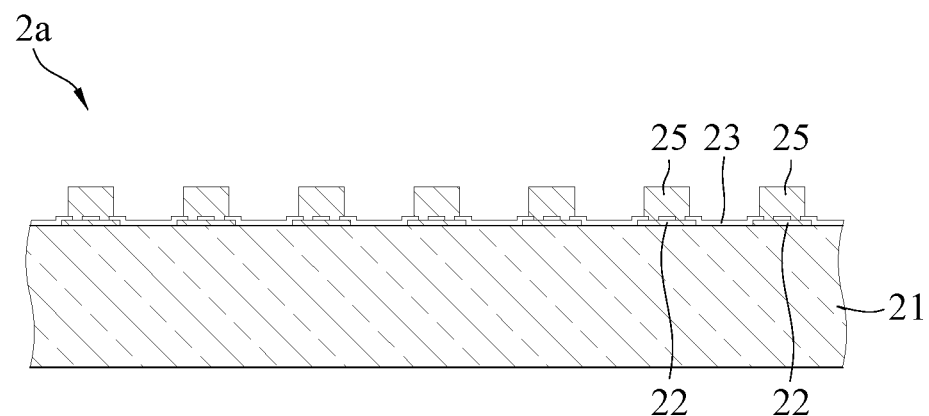
FIG. 2A is a schematic partial cross-sectional view of an electronic structure of the present disclosure.
Figure 2B:
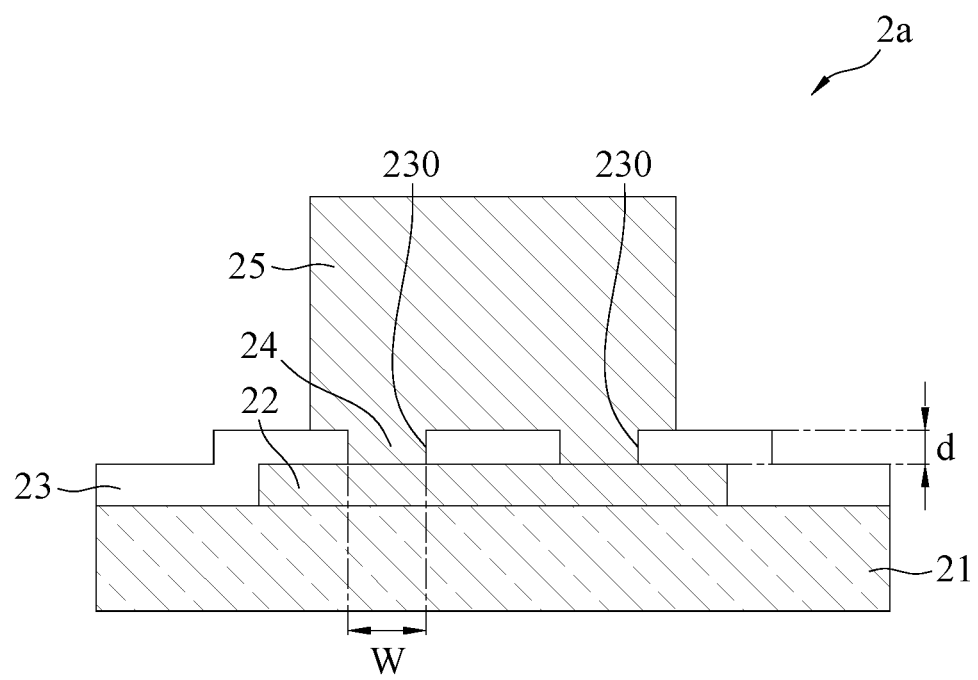
FIG. 2B is a schematic partial enlarged view of FIG. 2A.
Figure 2C:
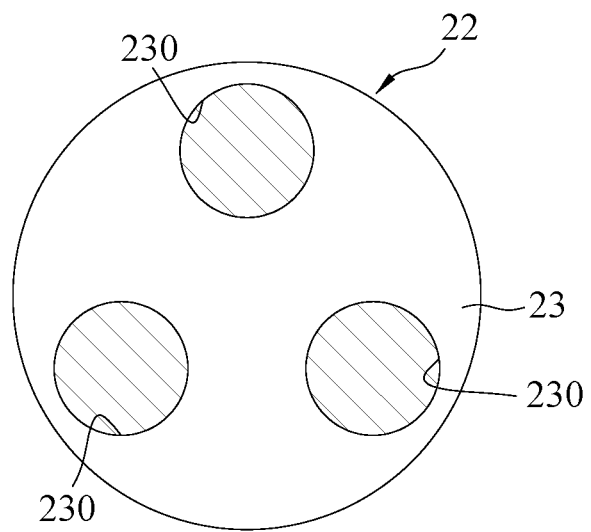
FIG. 2C is a schematic partial top view of FIG. 2B.

FIG. 2A, FIG. 2B and FIG. 2C are schematic cross-sectional and top views of an electronic structure 2a of the present disclosure. As shown in FIG. 2A to FIG. 2C, the electronic structure 2a of the present disclosure includes an electronic body 21, a plurality of contacts 22, at least one insulating layer 23, a plurality of conductive pillars 24 and a plurality of conductive elements 25.

The electronic body 21 is a semiconductor substrate, which is configured with a plurality of integrated circuit layers therein to form a chip specification.

The plurality of contacts 22 are provided on the outermost layer of the integrated circuit.

The insulating layer 23 is a passivation layer, such as silicon nitride or silicon oxide, but not limited to this.

Figure 2D:
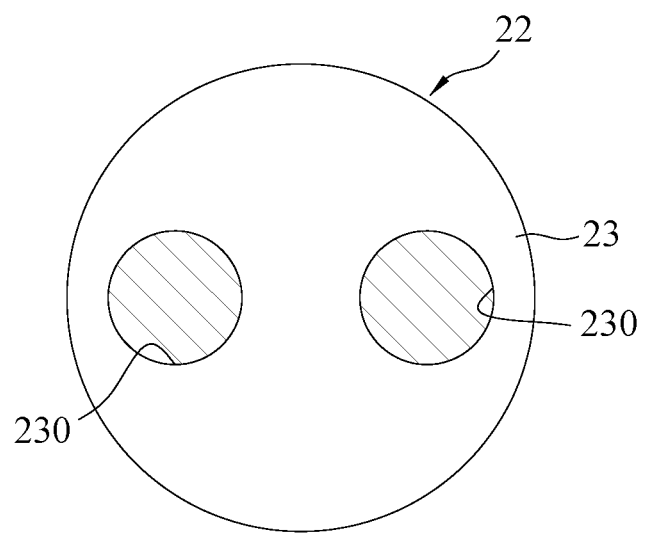
FIG. 2D is a schematic top view of another aspect of FIG. 2C.

In an embodiment, the insulating layer 23 is formed with a plurality of openings 230 on each of the contacts 22, so that parts of a surface of each contact 22 are exposed from the plurality of openings 230. For example, the insulating layer 23 can be formed with three openings 230 such as circular holes, the diameters of which are the same and are arranged equidistantly from each other, as shown in FIG. 2C. It should be understood that the number and arrangement of the openings 230 can be designed according to requirements (such as two circular holes shown in FIG. 2D), and are not limited to the above.

Figure 3A:
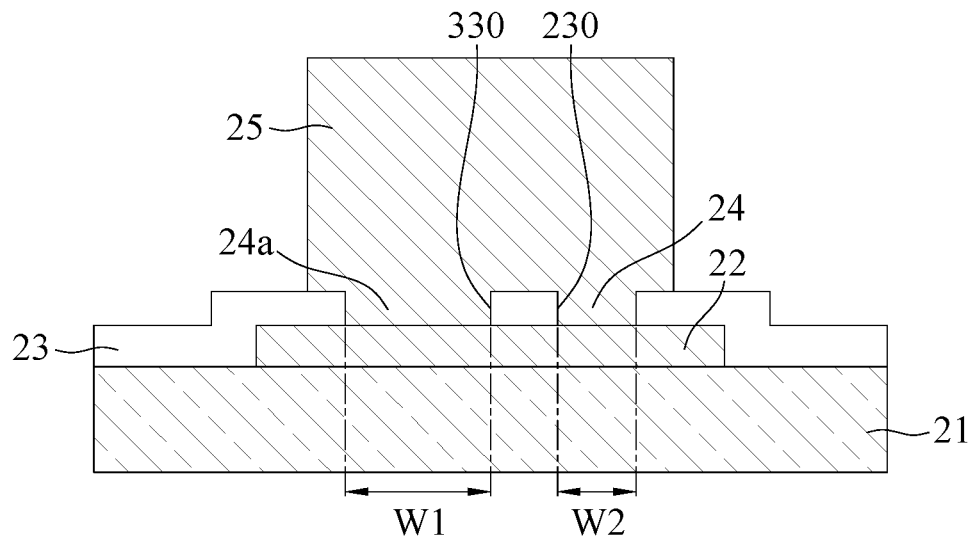
FIG. 3A is a schematic cross-sectional view of another aspect of FIG. 2B.

Furthermore, the aspect ratios (e.g., the depth to width ratios) of the openings 230 may be the same, for example, the ratio of a depth d to a width W of each of the openings 230 is greater than 0.38. Alternatively, the aspect ratios of at least two of the plurality of openings 230, 330 may be different, such as different widths W1, W2 as shown in FIG. 3A or the configuration of the conductive pillars 24, 24a on conductive elements 25b as shown in FIG. 4B-2.

Figure 3B:
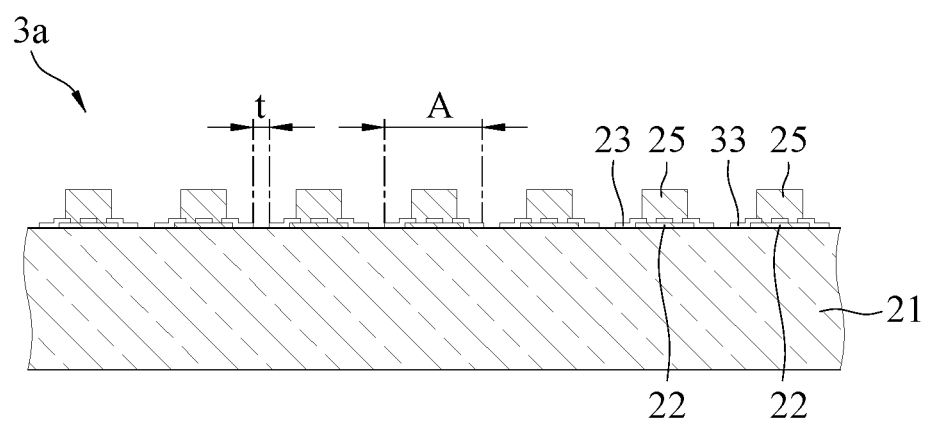
FIG. 3B is a schematic cross-sectional view of another aspect of FIG. 2A.

Also, the insulating layer 23 can be formed on the entire layout of the electronic body 21. In another embodiment, an insulating layer 33 can be correspondingly formed only at and around the contact 22 according to requirements, as shown in FIG. 3B, so as to form a plurality of coverage areas A spaced apart from each other (e.g., a distance t shown in FIG. 3B).

The plurality of conductive elements 25 are electrically connected to the plurality of contacts 22 via the plurality of conductive pillars 24, wherein each of the conductive pillars 24 is formed in each of the openings 230 to electrically connect each of the contacts 22.

In an embodiment, each of the conductive elements 25 and the plurality of conductive pillars 24 are integrally formed, and the plurality of conductive pillars 24 are provided on each of the contacts 22 to serve as multiple electrical connection paths, so that the other conductive pillars 24 can still be used for electrical connection when one of the conductive pillars 24 fails, wherein each of the conductive elements 25 can be a copper (Cu) pillar, a bump, or a combination thereof, etc.

Therefore, the electronic structure 2a of the present disclosure is designed to connect the plurality of conductive pillars 24 to each of the contacts 22, so that each of the conductive pillars 24 has a larger aspect ratio. Therefore, compared with the prior art, the conductive element 25 of the present disclosure can be stably disposed on the contact 22 without being easily deformed. For example, when the electronic structure 2a is used as a semiconductor chip and is flip-chip bonded onto a carrier structure 4a such as a packaging substrate via the plurality of conductive elements 25 (as shown in an electronic package 4 of FIG. 4A), each of the conductive elements 25 can disperse stress via the plurality of conductive pillars 24 during extrusion so as to prevent the conductive element 25 from breaking at the plurality of conductive pillars 24.

Figure 4A:
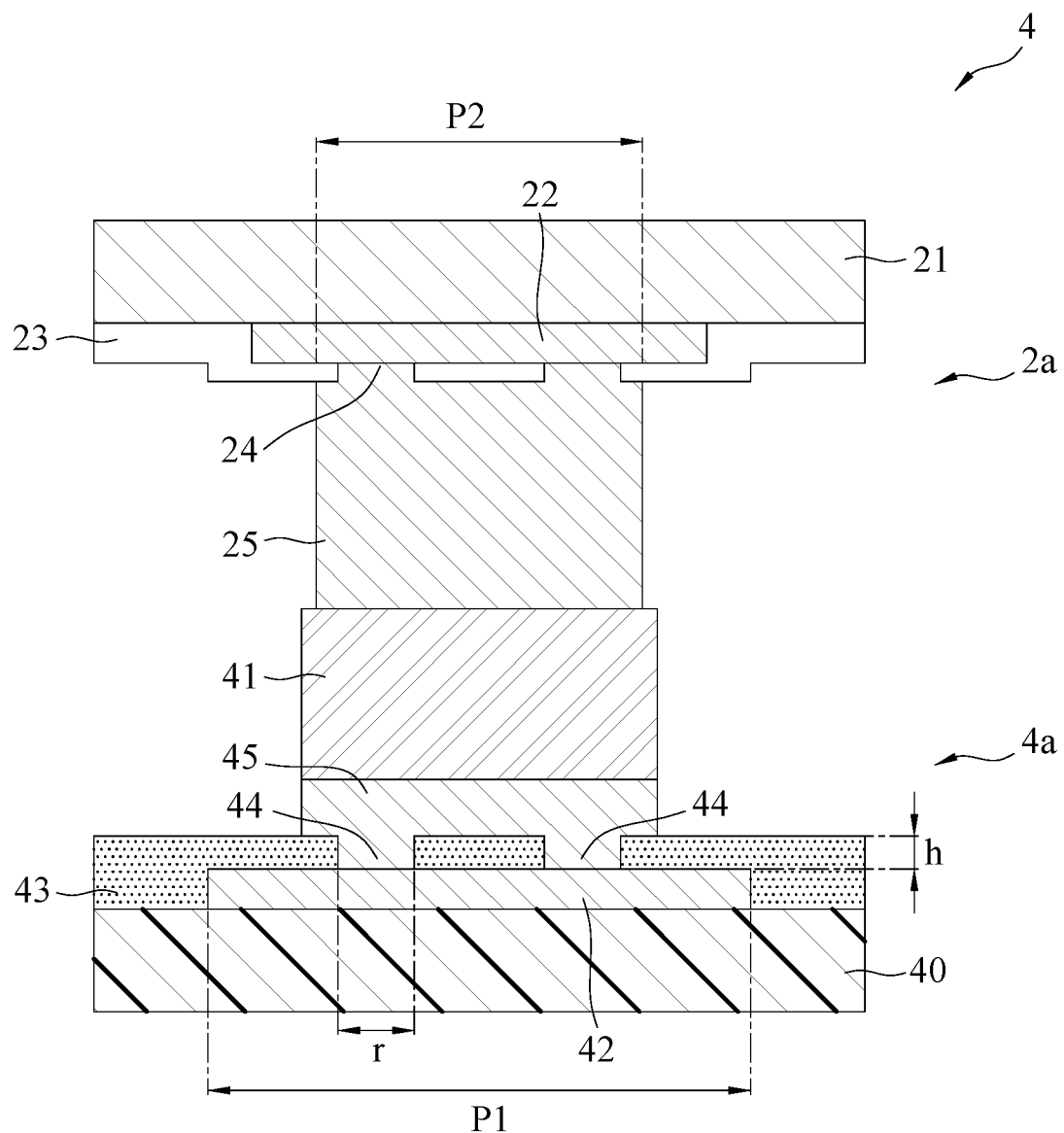
FIG. 4A is a schematic partial cross-sectional view of an electronic package according to a first embodiment of the present disclosure.
Figures 1, 4B:
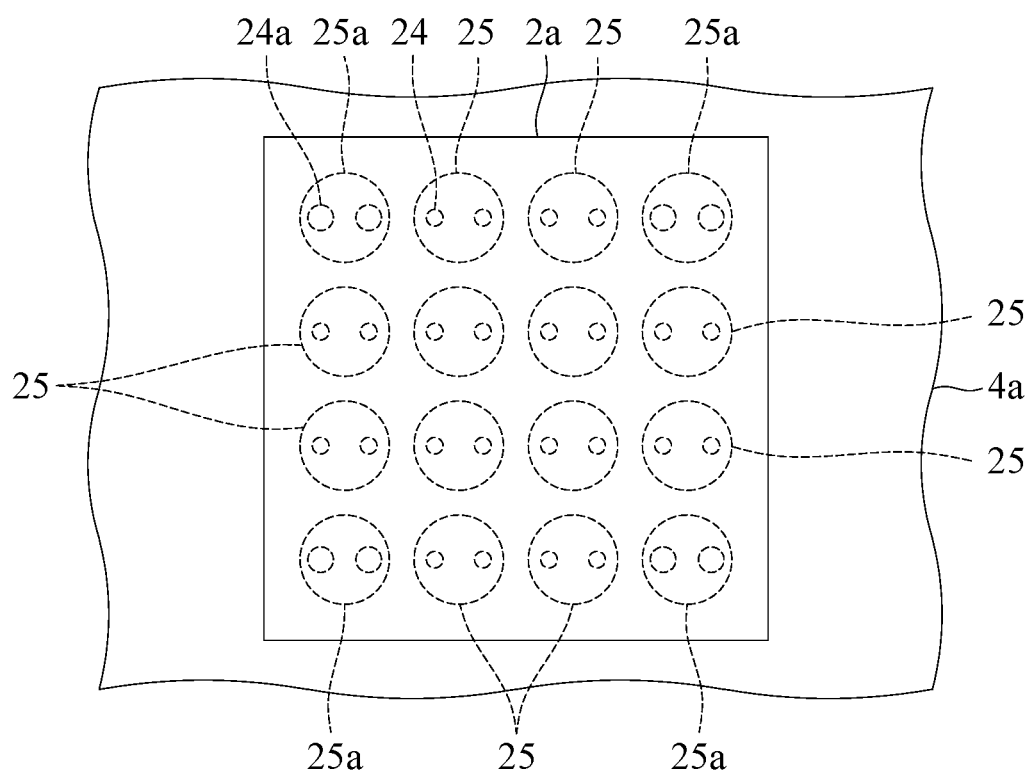
FIG. 4B-1 is a schematic partial top view of another aspect of FIG. 4A.
Figures 2, 4B:
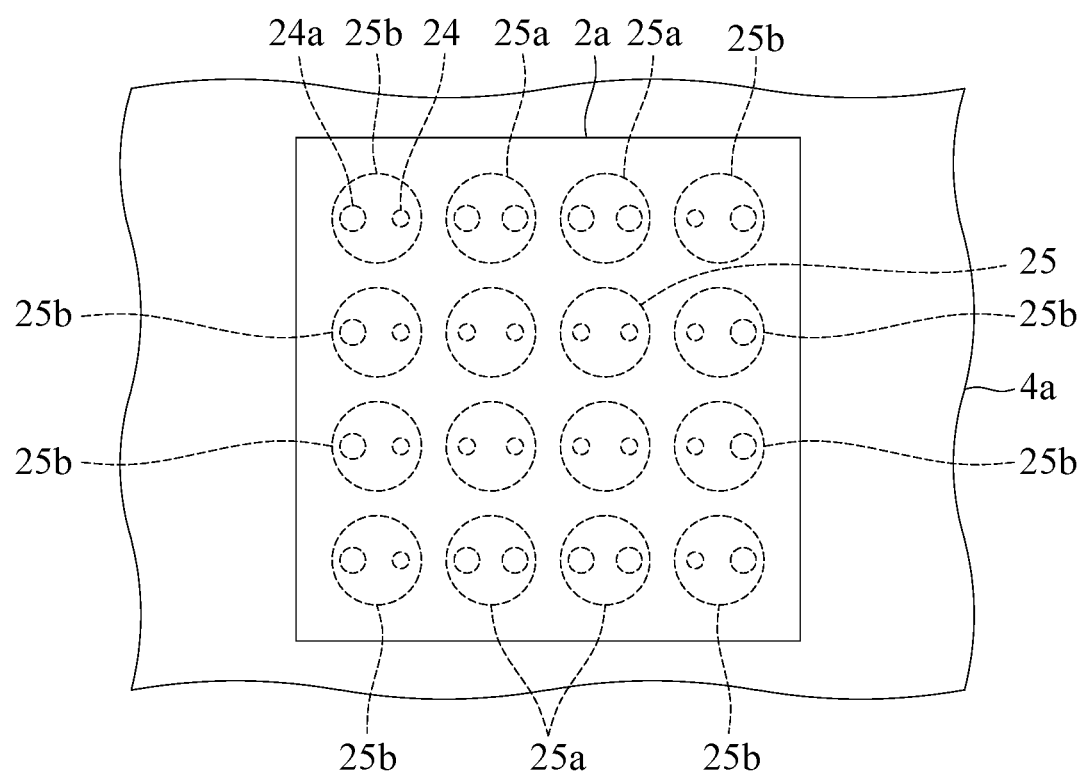

The carrier structure 4a includes a substrate body 40 having a circuit layer 42, an insulating protective layer 43 formed on the substrate body 40, and a plurality of electrical contact pads 45 formed on the insulating protective layer 43, as shown in FIG. 4A, and each of the electrical contact pads 45 is electrically connected to the circuit layer 42 by a plurality of conductive blind vias 44.

In an embodiment, the electrical contact pad 45 is of a micro-pad (μ-pad) specification, and the conductive element 25 is of a micro-element (μ-bump) specification, so that the conductive element 25 is bonded to the electrical contact pad 45 via a solder material 41 or the conductive element 25 is bonded to the electrical contact pad 45 in a metal-to-metal bonding manner. For example, each of the electrical contact pads 45 is connected onto each circuit layer 42 by the plurality of conductive blind vias 44, and the ratio of a depth h to a width r (i.e., aspect ratio) of each of the conductive blind vias 44 is the same, a preferred aspect ratio is 0.63. It should be understood that the aspect ratio of the conductive blind vias 44 and the aspect ratio of the conductive pillars 24 are different.

Furthermore, a vertical projection area P1 of the electrical contact pad 45 can be greater than a vertical projection area P2 of the conductive element 25 so as to prevent the problem of poor soldering caused by the misalignment of the conductive element 25 during the reflow operation.

Figures 3, 4B:
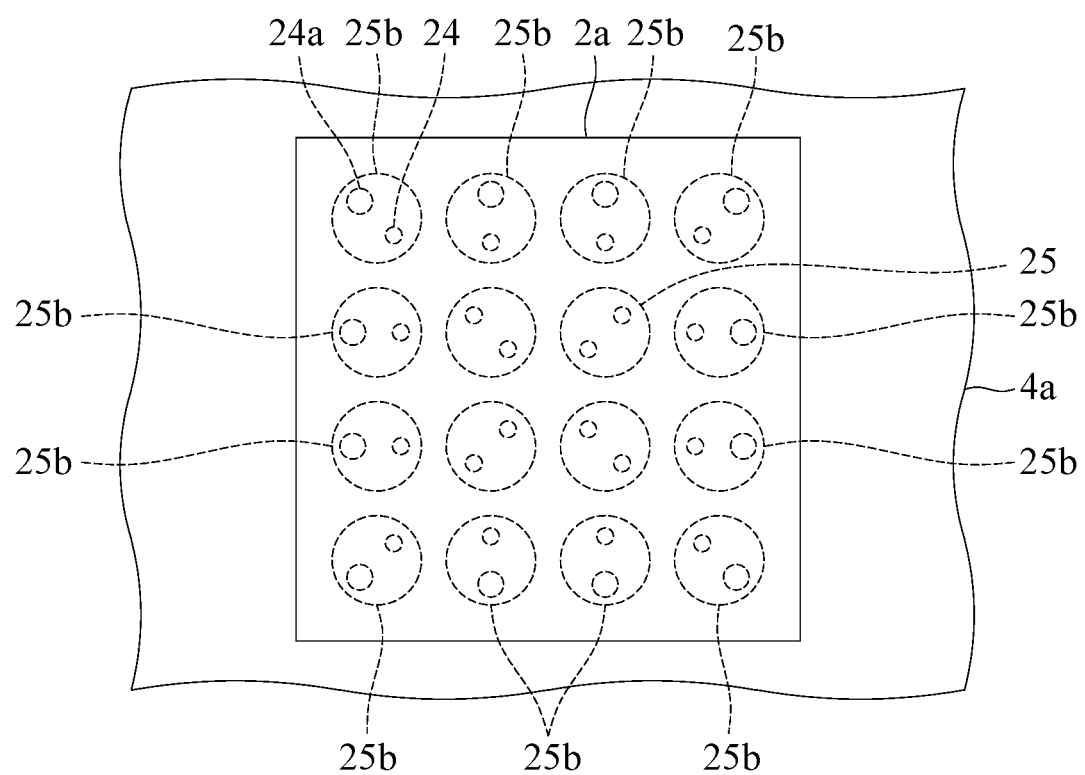
Figures 4, 4B:
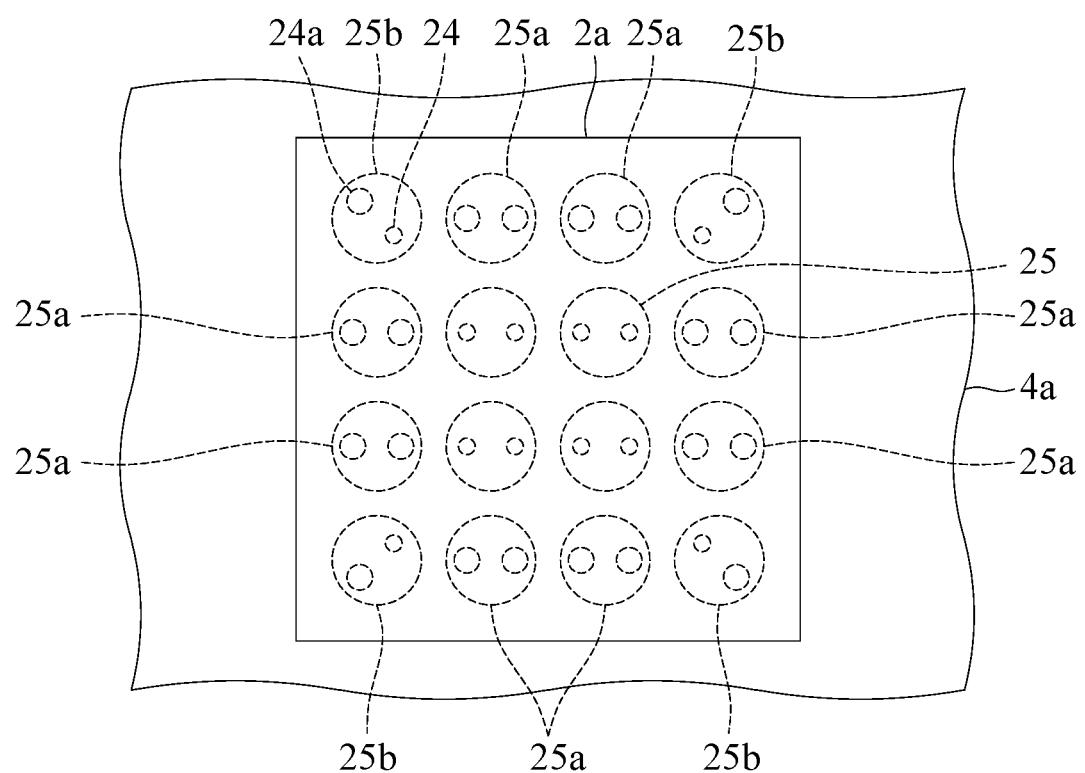
Figure 4C:
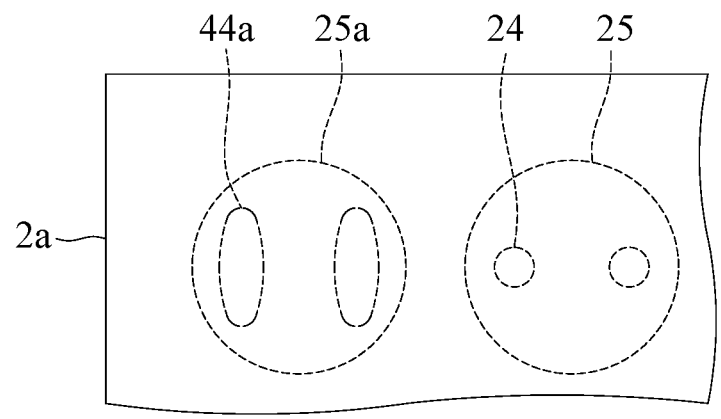
FIG. 4C and FIG. 4D are schematic partial top views of other different aspects of FIG. 4B-1.
Figure 4D:
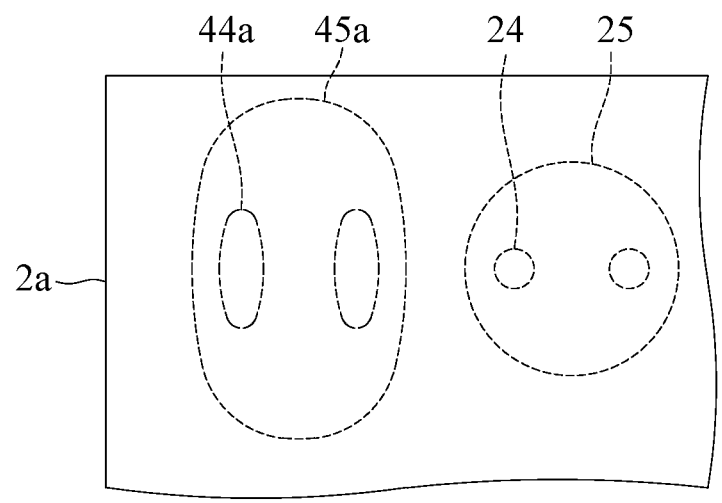

In addition, the aspect ratios of the conductive pillars 24 corresponding to at least two of the plurality of conductive elements 25 are different. For example, when the electronic structure 2a is a rectangle, the aspect ratio of the conductive pillars 24 corresponding to the conductive elements 25 at different positions can be adjusted according to requirements. Preferably, as shown in FIG. 4B-1 and FIG. 4B-2, the stress at the corners of the electronic structure 2a is relatively large, so the aspect ratio of the conductive pillars 24a corresponding to the conductive elements 25a, 25b located at the corners is relatively small (i.e., the area of the end surface of the conductive pillar 24a is larger), and the stress at other parts of the electronic structure 2a is smaller, so the aspect ratio of the conductive pillars 24 corresponding to the other conductive elements 25 is relatively large (i.e., the area of the end surface of the conductive pillar 24 is smaller), even the conductive pillars 24, 24a of different sizes corresponding to the conductive elements 25a, 25b can be arranged according to the direction of the size of the stress, as shown in FIG. 4B-3 and FIG. 4B-4, the conductive pillars 24 with smaller end surfaces are arranged toward the center of the electronic structure 2a. Further, the conductive elements 25a, 25b and/or the corresponding conductive pillars 24a can be changed in shape according to requirements, such as elongated (or elliptical-like) conductive pillars 44a and the conductive elements 45a shown in FIG. 4C and FIG. 4D, so as to disperse the stress. Therefore, the aspect ratio of the conductive pillars 24, 24a, 44a corresponding to the conductive elements 25, 25a, 25b, 45a can be adjusted according to the stress generated by the electronic structure 2a during packaging.

Figure 5:
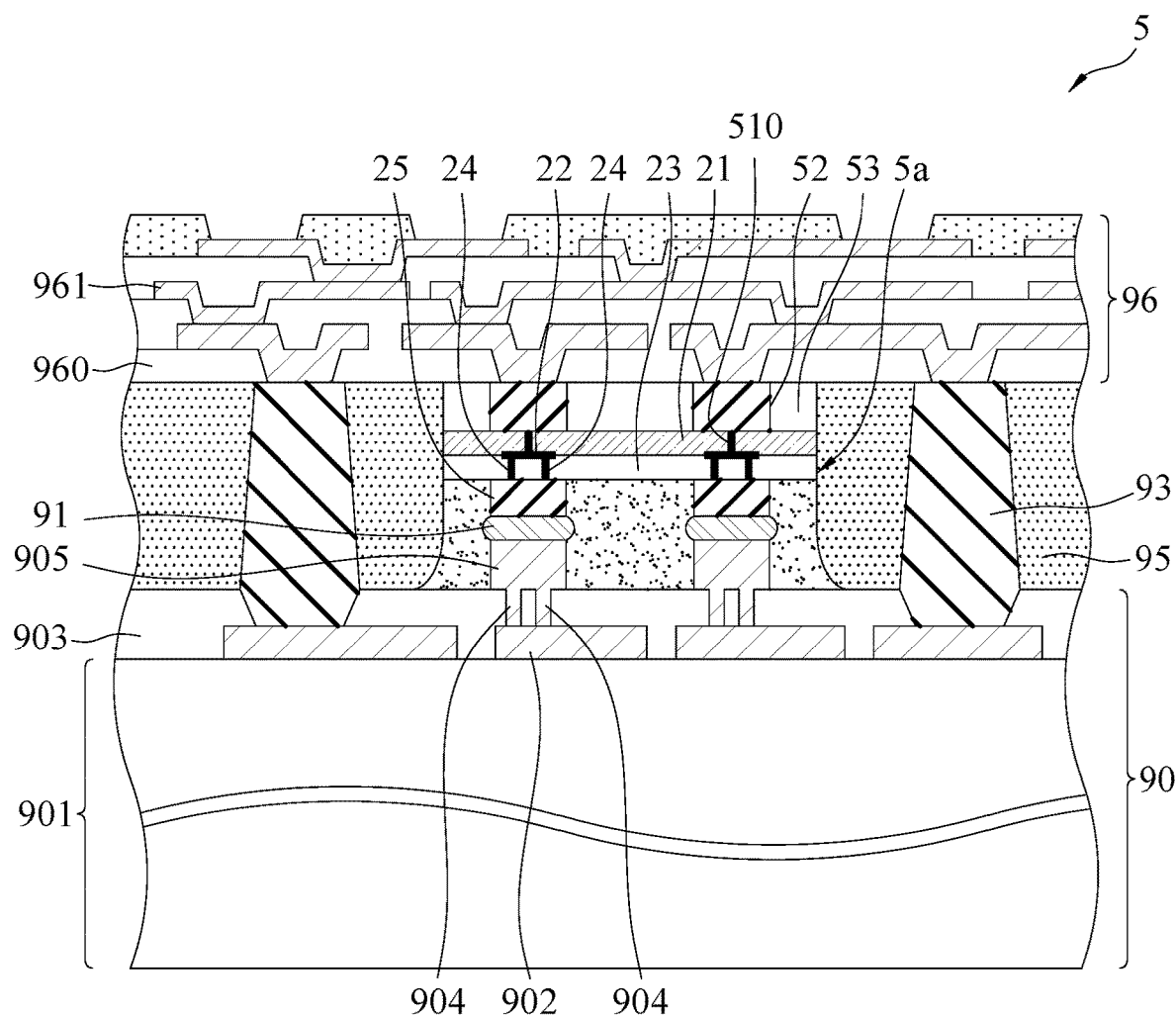
FIG. 5 is a schematic cross-sectional view of an electronic package according to a second embodiment of the present disclosure.

Further, as shown in FIG. 5, an electronic structure 5a can also be used as an interposer structure, which further comprises a plurality of conductive vias 510 (such as of through-silicon via (TSV) specifications) formed in the electronic body 21 and electrically connected to the contacts 22, a plurality of conductors 52 disposed on the other side of the electronic body 21 opposite to the contacts 22 and electrically connected to the conductive vias 510, and an insulating film 53 covering the plurality of conductors 52.

Further, the electronic structure 5a can be used in an electronic package 5. As shown in FIG. 5, the electronic package 5 further comprises a carrier structure 90 for carrying the electronic structure 5a, a plurality of conductive structures 93 disposed on the carrier structure 90, an encapsulation layer 95 covering the electronic structure 5a and the plurality of conductive structures 93, and a routing structure 96 formed on the encapsulation layer 95.

The carrier structure 90 is, for example, a packaging substrate with a core layer or a coreless carrier. A substrate body 901 of the carrier structure 90 is formed with a plurality of circuit layers 902 (such as fan-out type redistribution layers [RDLs]) on an insulating material, and an insulating protective layer 903 is formed on the outermost circuit layer 902, and at least one electrical contact pad 905 is formed on the insulating protective layer 903, so that the electrical contact pad 905 is electrically connected to the circuit layer 902 via a plurality of conductive blind vias 904. For example, the material for forming the circuit layer 902, the electrical contact pad 905 and the conductive blind vias 904 is copper, and the insulating material is a dielectric material such as polybenzoxazole (PBO), polyimide (PI), prepreg (PP), or the like.

In an embodiment, the conductive element 25 of the electronic structure 5a is bonded to the electrical contact pad 905 via a solder material 91.

Furthermore, the aspect ratio of the conductive blind vias 904 is different from the aspect ratio of the conductive pillars 24.

The plurality of conductive structures 93 are pillars and are electrically connected to the circuit layers 902, and the material for forming the plurality of conductive structures 93 is a metal material such as copper or a solder material.

The encapsulation layer 95 is formed on the carrier structure 90, and through a leveling process, the surface of the encapsulation layer 95 is flush with the end surfaces of the plurality of conductive structures 93 and the end surface of the insulating film 53 of the electronic structure 5a (or the end surfaces of the plurality of conductors 52), so that the end surfaces of the plurality of conductive structures 93 and the end surface of the insulating film 53 of the electronic structure 5a (or the end surfaces of the plurality of conductors 52) are exposed from the surface of the encapsulation layer 95. In an embodiment, the encapsulation layer 95 is an insulating material, such as an epoxy resin encapsulant, which can be formed on the carrier structure 90 by lamination or molding.

The routing structure 96 is electrically connected to the plurality of conductive structures 93 and the plurality of conductors 52 of the electronic structure 5a. In an embodiment, the routing structure 96 includes a plurality of dielectric layers 960 and a plurality of redistribution layers (RDLs) 961 disposed on the dielectric layers 960, and the outermost dielectric layer 960 can be used as a solder mask layer, so that the outermost redistribution layer 961 is partially exposed from the solder mask layer. It should be understood that the routing structure 96 may also include only one dielectric layer 960 and one redistribution layer 961. Therefore, in the subsequent process, at least one semiconductor chip (not shown) or other electronic elements can be mounted on the outermost redistribution layer 961.

Therefore, during the thermal cycle of the electronic package 5, the conductive element 25 can disperse the stress to the conductive pillars 24, so that the conductive element 25 will not be broken due to stress concentration, and can be effectively electrically connected to the contact 22.

In view of the above, in the electronic structure 2a, 3a, 5a of the present disclosure, the contact 22 and the conductive element 25, 25a, 25b are connected by the plurality of conductive pillars 24, 24a, so as to improve the aspect ratio of each of the conductive pillars 24, 24a, which can improve the yield of electroplating the conductive pillars 24, 24a, thereby increasing the reliability of the entire electronic structure 2a, 3a, 5a. Preferably, the aspect ratio of each of the conductive pillars 24, 24a is greater than 0.38 to prevent the problem of forming a dish on the top surface of the conductive element 25, 25a, thus preventing the conductive element 25, 25a, 25b from being deformed.

Moreover, the contact 22 and the conductive element 25, 25a, 25b are electrically connected via the plurality of conductive pillars 24, 24a, so that there are multiple electrical connection paths between the contact 22 and the conductive element 25, 25a, 25b. Therefore, after packaging, if one of the conductive pillars 24, 24a fails, the other conductive pillars 24, 24*a* can still be used to achieve the purpose of electrical connection, thereby increasing the electrical conductivity.

Furthermore, the insulating layer 33 is discontinuously arranged, as shown in FIG. 3B, such that the insulating layer 33 between the adjacent conductive elements 25 is a discontinuous structure for forming a stress buffer mechanism, so that the warpage of the electronic structure 3*a* can be avoided to improve the reliability and conduction yield.

In addition, during packaging, the electronic package 4, 5 of the present disclosure is designed to connect each of the contacts 22 by the plurality of conductive pillars 24, so as to disperse the stress of the conductive element 25 in the plurality of conductive pillars 24, thereby preventing the conductive element 25 from breaking at the conductive pillars 24. Similarly, the stress of the electrical contact pad 45, 905 can also be dispersed in the plurality of conductive blind vias 44, 904 to prevent the electrical contact pad 45, 905 from breaking at the conductive blind vias 44, 904.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic structure, comprising:
an electronic body;
a plurality of contacts disposed on the electronic body;
an insulating layer having a plurality of openings and formed on the electronic body, wherein parts of a surface of each of the contacts are exposed from the plurality of openings;
a plurality of conductive pillars disposed in the plurality of openings and electrically connected to the plurality of contacts; and
a plurality of conductive elements disposed on the plurality of conductive pillars, wherein each of the conductive elements is connected to each of the contacts via the plurality of conductive pillars, wherein aspect ratios of the plurality of conductive pillars in the plurality of openings of the insulating layer are inversely proportional to stress distribution of the electronic structure; and
wherein the conductive pillars of different sizes corresponding to the conductive elements of the plurality of conductive elements are arranged according to a direction of a size of the stress and the conductive pillars with smaller end surfaces are arranged toward a center of the electronic structure.

2. The electronic structure of claim 1, wherein at least one of the plurality of openings has an aspect ratio greater than 0.38.

3. The electronic structure of claim 1, wherein the plurality of conductive pillars have a same aspect ratio.

4. The electronic structure of claim 1, wherein at least two of the plurality of conductive pillars have different aspect ratios.

5. The electronic structure of claim 1, wherein the insulating layer is discontinuously arranged on the electronic body, such that portions of the insulating layer between the adjacent conductive elements are free from being connected to each other.

6. An electronic package, comprising:
a carrier structure comprising a substrate body having a circuit layer, an insulating protective layer formed on the substrate body, and a plurality of electrical contact pads disposed on the insulating protective layer, wherein the plurality of electrical contact pads are electrically connected to the circuit layer via a plurality of conductive blind vias; and
an electronic structure bonded to the plurality of electrical contact pads via the plurality of conductive elements thereof;
wherein the electronic structure, comprising:
an electronic body;
a plurality of contacts disposed on the electronic body;
an insulating layer having a plurality of openings and formed on the electronic body, wherein parts of a surface of each of the contacts are exposed from the plurality of openings;
a plurality of conductive pillars disposed in the plurality of openings and electrically connected to the plurality of contacts; and
a plurality of conductive elements disposed on the plurality of conductive pillars,
wherein each of the conductive elements is connected to each of the contacts via the plurality of conductive pillars, wherein aspect ratios of the plurality of conductive pillars in the plurality of openings of the insulating layer are inversely proportional to stress distribution of the electronic structure; and
wherein the conductive pillars of different sizes corresponding to the conductive elements of the plurality of conductive elements are arranged according to a direction of a size of the stress and the conductive pillars with smaller end surfaces are arranged toward a center of the electronic structure.

7. The electronic package of claim 6, wherein each of the electrical contact pads is electrically connected to the circuit layer via the plurality of conductive blind vias.

8. The electronic package of claim 6, wherein the plurality of conductive blind vias have an aspect ratio different from the aspect ratio of the plurality of conductive pillars.

9. The electronic package of claim 6, wherein each of the electrical contact pads has a vertical projection area greater than a vertical projection area of each of the conductive elements.

10. The electronic package of claim 6, wherein the aspect ratios of the conductive pillars corresponding to at least two of the plurality of conductive elements are different.

* * * * *